United States Patent [19]
Hobbs et al.

[11] Patent Number: 5,652,410
[45] Date of Patent: Jul. 29, 1997

[54] CONDUCTIVE INSERT FOR PROVIDING ELECTROMAGNETIC CHARGE PROTECTION

[75] Inventors: Steven P. Hobbs, Stewartville; Stephen E. Wheeler, Rochester, both of Minn.

[73] Assignee: International Business Machines Corporation, Armonk, N.Y.

[21] Appl. No.: 680,256

[22] Filed: Jul. 11, 1996

Related U.S. Application Data

[63] Continuation of Ser. No. 298,804, Aug. 31, 1994, abandoned.

[51] Int. Cl.⁶ .................................................. H05K 9/00
[52] U.S. Cl. ...................... 174/35 R; 361/816; 361/818
[58] Field of Search .......................... 174/35 R, 35 MS, 174/35 GC; 439/607; 361/816, 818

[56] References Cited

U.S. PATENT DOCUMENTS

| | | | |
|---|---|---|---|
| 4,427,114 | 1/1984 | Howell et al. | 206/328 |
| 4,557,379 | 12/1985 | Lane et al. | 206/328 |
| 4,641,223 | 2/1987 | McIntosh | 219/328 X |
| 4,680,676 | 7/1987 | Petratos et al. | 455/301 X |
| 4,725,918 | 2/1988 | Bakker | 361/220 |
| 4,791,524 | 12/1988 | Teigen et al. | 361/212 |
| 5,012,924 | 5/1991 | Murphy | 206/331 |
| 5,066,240 | 11/1991 | Verdun | 439/181 |
| 5,102,712 | 4/1992 | Peirce et al. | 428/76 |
| 5,150,282 | 9/1992 | Tomura et al. | 174/35 MS X |
| 5,167,326 | 12/1992 | Murphy | 206/331 |
| 5,170,318 | 12/1992 | Catala et al. | 361/323 |
| 5,214,562 | 5/1993 | Levi | 361/212 |
| 5,241,695 | 8/1993 | Roshitsh et al. | 455/128 |
| 5,294,994 | 3/1994 | Robinson et al. | 348/825 |
| 5,374,779 | 12/1994 | Konishi | 174/35 R |
| 5,416,668 | 5/1995 | Benzoni | 361/816 |

OTHER PUBLICATIONS

*Anti–Static Thermoformed Plastic Insert For Packaging Cartons Used For Shipping Electronic Card Assemblies,* IBM Technical Disclosure Bulletin, vol. 28, No. 9, Feb., 1986, pp. 4077–4078.

*Molding Of EMI and RFI Shielding Into Product Enclosures,* IBM Technical Disclourse Bulletin, vol. 27, No. 10B, Mar. 1985, p. 5971.

*Primary Examiner*—Bot L. Ledynh
*Attorney, Agent, or Firm*—Felsman, Bradley, Gunter & Dillon, L.L.P.

[57] ABSTRACT

A conductive insert for protecting an externally mounted microelectronic device is disclosed. The conductive insert is designed to prevent ESD (Electrostatic Discharge) or RFI (Radio Frequency Interference) destruction or inoperability of the microelectronic device. The conductive insert includes a first exterior surface and a second interior surface. The second interior surface has a conductor material applied thereon for providing ESD or RFI protection to the externally mounted electronic device. To protect the externally mounted microelectronic device, the conductive insert mounts within a mounting plate for covering the externally mounted electronic device. Instead of having a conductive material applied to the interior surface, the conductive insert may be manufactured from a conductive material initially. Additionally, electrically conductive finger springs can be formed in the conductive insert to provide electrical connection between the mounting plate and the microelectronic device or conductive product case.

5 Claims, 4 Drawing Sheets

CONDUCTIVE INSERT FOR PROVIDING ELECTROMAGNETIC CHARGE PROTECTION

BACKGROUND OF THE INVENTION

This is a continuation of application Ser. No. 08/298,804, filed Aug. 31, 1994, now abandoned.

TECHNICAL FIELD

The present invention relates, generally, to a device for providing electromagnetic charge protection and, more particularly, to a conductive insert for providing electromagnetic charge protection to electronics externally connected to an associated structure.

DESCRIPTION OF THE RELATED ART

Microelectronics circuits, specifically, the fabricated integrated circuits therein, can be readily destroyed or rendered temporarily inoperable if exposed to electrostatic discharge (ESD) or radio frequency interference (RFI). Typically, once the integrated circuits are placed in a finished product, they are insulated from electrostatic discharge or radio frequency interference. This is accomplished by placing the devices inside metal cages that shield or dissipate ESD and RFI. Unfortunately, some electronic devices must be outside these metal cages and, therefore, are exposed to ESD and RFI problems.

One type of device includes the operation panels typically found on a large computer, such as, for example, a midrange or mainframe computer system. Accordingly, a plastic decorative bezel, whose inside surface is painted with nickel or copper conductive paint to provide ESD and RFI shielding, is fastened to the system frame such that it makes electrical contact with the metal case and encloses the electronics within a conductive envelope.

Problems associated with this solution include the use of expensive extensive hand masking around the areas that must remain nonconductive. Secondly, the plastic bezels, once painted with this conductive paint, cannot be recycled, and, thus, are environmentally poor. Additionally, the paint is difficult to apply with the required consistency as it is hard to maintain even paint coverage inside tight inside corners. In this case, bridging and paint blow-back occur as the paint is sprayed on. Accordingly, what is needed is a structure that protects externally mounted electronic devices without requiring extensive design and manufacturing effort and expense to implement.

SUMMARY OF THE INVENTION

It is therefore one object of the present invention to provide electromagnetic charge protection.

It is another object of the present invention to provide a conductive insert for electromagnetic discharge and radio frequency interference protection to electronics externally connected to an associated structure.

The foregoing objects are achieved as is now described.

According to the present invention, a conductive insert for protecting an externally mounted microelectronic device is disclosed. The conductive insert is designed to prevent destruction or inoperability of the microelectronic device caused by electrostatic discharge or radio frequency interference. The conductive insert includes a first exterior surface and a second interior surface. The second interior surface has a conductor material applied thereon for providing ESD and RFI protection to the externally mounted electronic device. To protect the externally mounted microelectronic device, the conductive insert mounts within a mounting plate for covering the externally mounted electronic device. Instead of having a conductive material applied to the interior surface, the conductive insert may be manufactured from a conductive material initially. Additionally, electrically conductive finger springs can be formed in the conductive insert to provide electrical connection, if necessary, between the conductive insert and the microelectronic device or to enhance electrical connection between the conductive insert and the metal case of the product.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
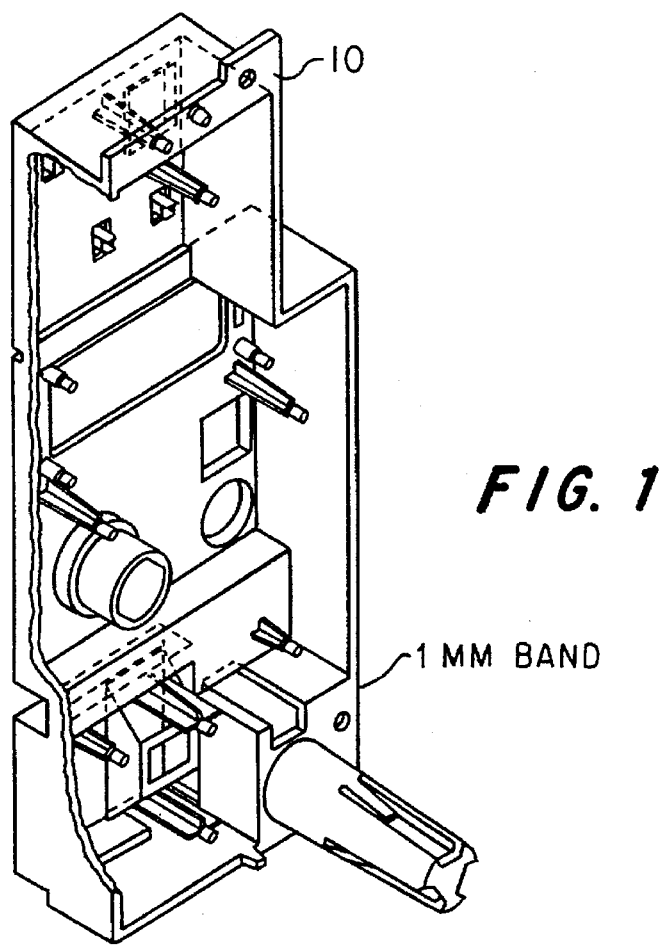
FIG. 1 is a perspective view of an operating bezel normally covering an externally mounted device.

With reference now to the figures and in particular with reference to FIG. 1, a partial cutaway perspective view of an operator bezel or panel 10 used in the prior art is shown.

Figure 2:
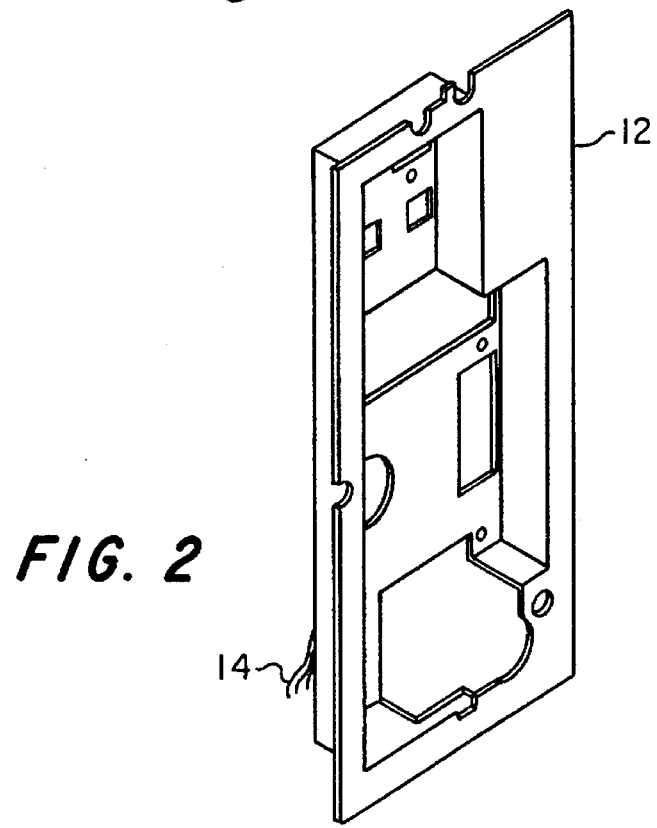
FIG. 2 depicts a conductive insert for providing ESD and RFI protection.

FIG. 2, is a perspective view of a conductive insert 12, disclosed for inserting between an externally mounted electronic device and its operator panel 10.

Conductive insert 12 is made from a thermal formed plastic part made conductive so as to provide electrostatic discharge protection and radio frequency interference protection of an externally mounted electronic device. Conductive insert 12 is made conductive by adding a conductive surface film through either vacuum deposition, via laminated foil, to the base material prior to forming insert 12. This method, although somewhat expensive, eliminates any expensive secondary operation, such as masking, to the operator panel bezel itself, and yields a cost reduction of about one-half of what is required to prepare the operator bezel to be conductive so as to provide ESD and RFI protection.

Another method for providing conductivity to insert 10 is to incorporate conductive particles in the raw material before performing the process thermal forming of insert 12. Another method is to paint a non-conductive, pre-made, thermal formed insert, already having all openings and features in place, with a conductive paint similar to that used on the operator panel bezels in the prior solutions. The use of conductive paint is the preferred method since it is simplistic and well known. Additionally, the electrical characteristics of conductive paint are well known and approved for standard use. Other processes may, however, be used to apply conductive surface coatings to a pre-made thermal formed insert by either electrolysis copper or nickel plating or vacuum deposition of aluminum or other materials, which are but two examples.

Although painting the insert appears to be identical to painting a bare bezel, important advantages are achieved. Specifically, the thermal formed insert is inexpensive to manufacture as it can be made from low cost material, such as styrene or untilled polycarbonate sheet, and requires little tooling and can be produced in high volumes. Further, the part does not need to be masked before painting or thermal deposition, or the like. When painting panel 10, some areas must stay non-conductive; therefore, masking is required such as to prevent overspray from the decorative portion of panel 10. For areas that must remain non-conductive on conductive insert 12, those areas can be punched out as conductive insert 12 merely serves as a laminate between operator panel 10 and a microelectronics device. Additionally, the operator bezels typically are processed one bezel at a time. Using conductive inserts allows for high volume output as multiple inserts may be thermally formed in a sheet at one time and then painted prior to cutting. This results in tremendous labor and cost savings over the prior methods.

Conductive insert 12 also serves as a spring when spring fingers 14, which, being conductive, can provide electrical contact between the elements for which the spring fingers, are designed. This allows the metal finger stock normally used in some applications to be eliminated for a further cost savings. The only increase in complexity of preparing the conductive insert is to provide trim tooling and slight design modifications. Spring fingers 14 extend from the exterior surface of conductive insert 12 so as to bias it against panel 10 and toward microelectronics device 16.

Figure 3:
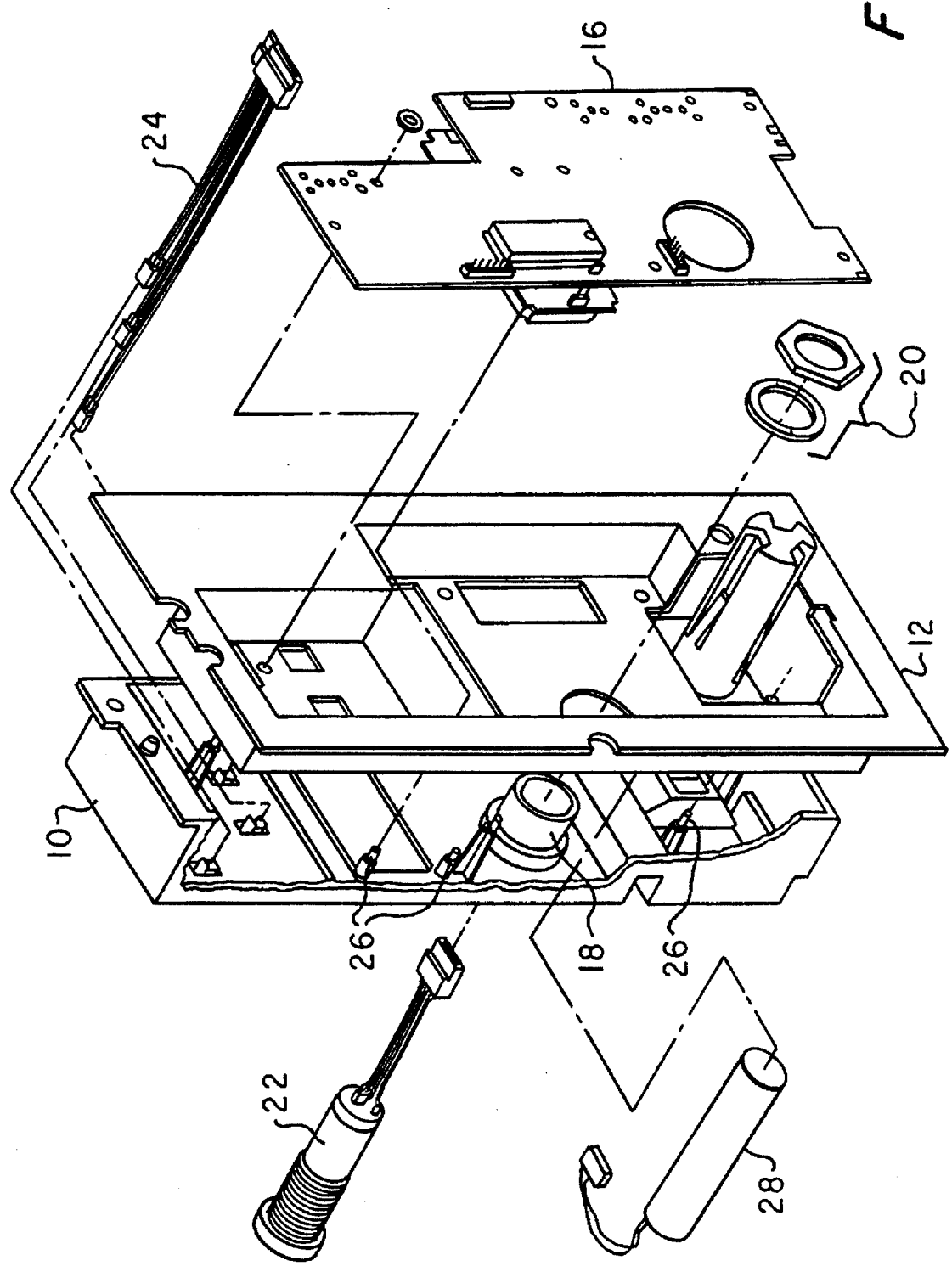
FIG. 3 shows an exploded view of how the conductive insert of FIG. 2 sandwiches between the operating bezel and a microelectronics part to be protected.

FIG. 3 depicts an exploded view of conductive insert 12 sandwiching between operator panel bezel 10 and microelectronics device 16. Microelectronics device 16 is affixed to operator panel bezel 10 with small screws or other fasteners (not shown) via molded standoffs 26, thus trapping conductive insert 12. Conductive insert 12 fits over standoffs 26 via holes punched in its body; the holes provide a friction fit, assuring correct lateral positioning with respect to bezel 10, microelectronics device 16, and the other assembled parts described below. The friction fit assures there is not lateral shifting of the insert or inadvertent contact between its conductive side and any logic or parts within the bezel. Further assembled is operator accessible keyswitch 22, which is affixed to operator panel bezel with nut and washer 20 via molded boss 18. Keyswitch 22 is an item that, electrically, cannot be mounted to a conductive surface and, thus, protrudes through a clearance hole in conductive insert 12. Keyswitch 22 is electrically connected to microelectronics device 16 via a cable and connector integral with the keyswitch. In the original configuration where operator panel bezel 10 was painted with conductive paint, the mounting area for keyswitch 22 required expensive masking. An additional electronic strap 24, which has LED's at the terminated end of the strap provides information to the operator, communicating system performance or other status through microelectronics device 16. The LED's at the end of strap 24 are snap fit into features molded to bezel 10 and, similar to keyswitch 22, protrude through holes punched in conductive insert 12. In the original configuration using a conductive painted bezel, expensive masking was also required in this area. Completing the assembly is a small battery 28 that friction fits in another molded feature in bezel 10 and, again similarly to keyswitch 22, protrudes through a punched opening in conductive insert 12, thus avoiding the masking required in the original configuration mentioned previously.

Conductive insert 12, being laterally constrained by standoffs 26, is further constrained in a direction perpendicular to the place of microelectronics device 16 when the assembly is mounted to the surface of the machine or computing system, which is constructed of metal and is unpainted to provide a conductive surface, via screws through the outer flange of bezel 10. It will be noted that the outer flange of insert 12 (parallel to the plane of microelectronics device 16 and larger than the outside perimeter of bezel 10) is thus trapped between the bezel and the machine surface, (not shown in the figure but to the right of the depicted components) ensuring proper location in the direction perpendicular to microelectronics device 16. The action of trapping the insert as described creates electrical contact between the insert and the machine surface and places microelectronic device 16 within a conductive enclosure.

Figure 4:
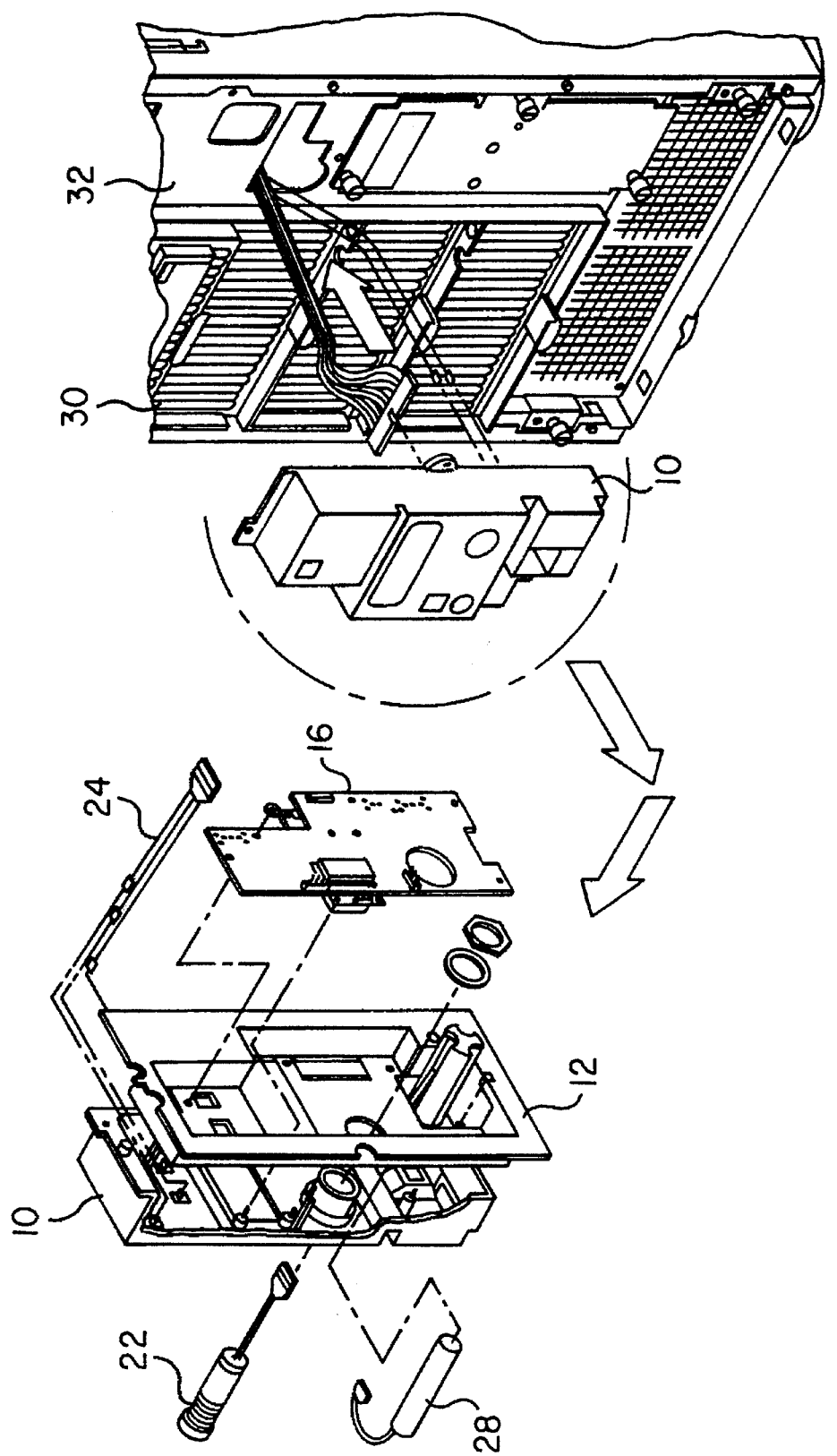
FIG. 4 depicts an exploded view of the attachment of the electronic device to a computer system according the present invention; and, FIG. 5 is a partial exploded view of the assembled computer system with ESD and RFI protection bezel insert.
Figure 5:
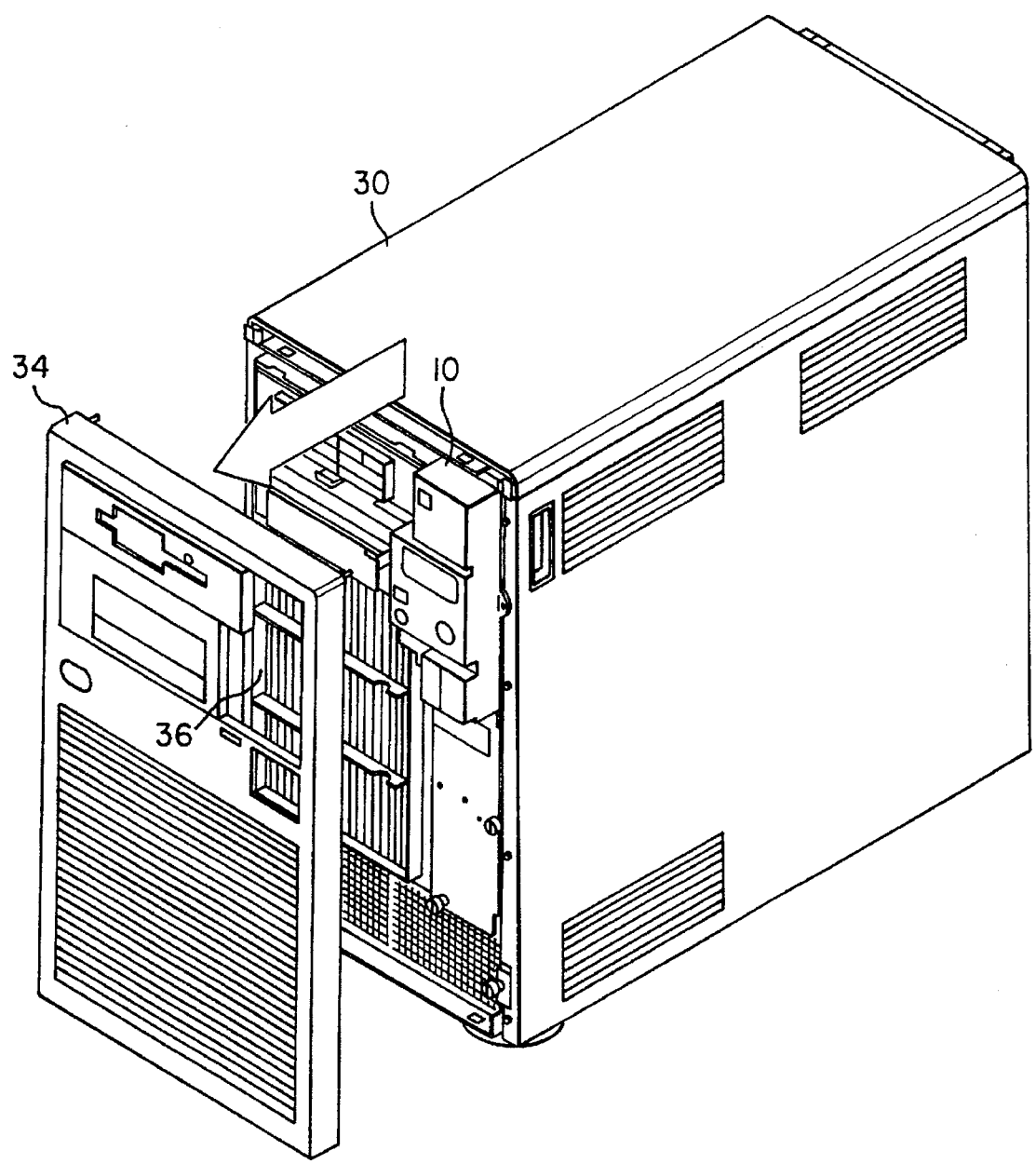

FIG. 4 depicts an exploded view of how conductive insert 12 and operator panel bezel 16 fit over microelectronic device 16 and connect to a computer system 30. Conductive insert 12 electrically connects with an exterior surface panel 32, which is made of a conductive material to provide ESD and RFI protection to the components within computer system 30 and which, with conductive insert 12, creates a conductive enclosure similarly protecting microelectronic device 16. The assembled computer system 30, shown in FIG. 5, provides a protective conductive enclosure for the microelectronic device. A decorative coverplate 34 mounts to the front of computer system 30 while allowing operator bezel 10 to fit through appropriate openings 36 for access by a system user.

Although insert 12 is not easily recyclable, operator bezel 10, which otherwise would have been manufactured with the conductive coating or particles, is much more readily recyclable. Additionally, insert 12 requires less material that bezel 10, thus reducing further the amount of waste that would normally occur once the bezel is discarded.

While the invention has been particularly shown and described with reference to a preferred embodiment, it will be understood by those skilled in the art that various changes in form and detail may be made therein without departing from the spirit and scope of the invention.

We claim:

1. A structure for providing ESD and RFI protection to an externally mounted electronic device on a computer system, comprising:

a mounting plate for covering said externally mounted electronic device, wherein said device is a keyswitch for use in said computer system; and a conductive insert including conductive spring fingers, mounted within said mounting plate, having a first exterior surface and a second interior surface, said second interior surface having a conductive material applied thereto for providing said ESD and RFI protection, said conductive spring fingers extending from said first exterior surface so as to bias said conductive insert against said mounting plate and toward said keyswitch device;

wherein said electronic device mounts to a conductive surface, thereby forming a conductive enclosure with said conductive insert and said conductive surface.

2. A computer system having a structure for providing ESD and RFI protection to an externally mounted computer system keyswitch electronic device comprising:

a conductive system enclosure having an exterior surface;

a mounting plate for covering said externally mounted electronic device; and a conductive insert including conductive spring fingers, mounted within said mounting plate and to said exterior surface thereby forming a protective conductive device enclosure for providing said ESD and RFI protection to said externally mounted electronic device, said conductive insert having an outer flange which is generally parallel to a plane defined by said electronic device, said flange further being larger than an outside perimeter of said mounting plate.

3. The invention according to claim 2 wherein said conductive insert is made conductive by use of a conductive paint applied to at least one surface.

4. The invention according to claim 2 wherein said conductive insert further includes a metal applied through deposition thereby providing said conductivity.

5. The invention according to claim 2 wherein said conductive insert further comprises:

a first exterior surface;

a second interior surface, wherein said first exterior surface and said second interior surface are made from a conductive material thereby providing said ESD and RFI protection to said externally mounted electronic device.

* * * * *